United States Patent [19]

Ferrante

[11] Patent Number: 5,425,840
[45] Date of Patent: Jun. 20, 1995

[54] AUTOMATED PROCESS FOR MAKING FLEXIBLE PLATES FROM A SHEET INTRODUCED SENSITIVE SIDE FACING UPWARDS AND DEVICE FOR IMPLEMENTING THE PROCESS

[75] Inventor: Mario Ferrante, Laxou, France
[73] Assignee: Photomeca, Pompey, France
[21] Appl. No.: 132,143
[22] Filed: Oct. 5, 1993

[30] Foreign Application Priority Data

Oct. 7, 1992 [FR] France .................. 92 12266

[51] Int. Cl.⁶ .................. B44C 1/22; C23F 1/02
[52] U.S. Cl. .................. 216/83; 216/52
[58] Field of Search ............... 156/626, 654, 668, 345, 156/905

[56] References Cited

U.S. PATENT DOCUMENTS 3,169,066 2/1965 Hoerner .................. 156/905 X
3,271,226 9/1966 Staehle et al. .................. 156/668 X
3,411,973 11/1968 Siler .................. 156/668 X

*Primary Examiner*—William Powell
*Attorney, Agent, or Firm*—Weiser & Associates

[57] ABSTRACT

A process for making plates from a photopolymer sheet which has been pre-exposed to ultraviolet radiation for conversion into printing plates for flexography, letterpress or dry-offset printing, includes the steps of inserting the sheet into an apparatus, sensitive side facing upwards and at high speed, so that the sheet is received on an etching plane and beneath a set of brushes, and etching the sheet under forces resulting from alternating movement of the brushes and to-and-fro movement of the brushes in a horizontal direction perpendicular to the alternating movement of the brushes. The sheet is automatically held in position during etching. Also disclosed is an apparatus for implementing this process, allowing for very rapid etching.

10 Claims, 3 Drawing Sheets

AUTOMATED PROCESS FOR MAKING FLEXIBLE PLATES FROM A SHEET INTRODUCED SENSITIVE SIDE FACING UPWARDS AND DEVICE FOR IMPLEMENTING THE PROCESS

BACKGROUND OF THE INVENTION

The present invention relates to a process for the production of flexible plates, which can be used for the production of prints in flexography, letterpress or dry-offset printing, and it also relates to a device for implementing the process.

More exactly, the invention relates to a process for treating photopolymer sheets of any size very rapidly so as to convert them into printing plates.

It is already known that a plate for flexography or letterpress printing may be obtained by exposing a sheet of photopolymer sensitive material to ultraviolet radiation, with the interposition of a negative film which leaves the areas which are to come into relief on the finished plate exposed to the radiation.

The radiation cures these areas and the material of the protected surface is subsequently removed by brushing it with the aid of flat or rotary brushes or by spray nozzles; with a solvent or water acting as wetting agent. The operation is continued until the areas which have been exposed are sufficiently in relief.

A first object of the invention is to automate the entire etching process completely.

Moreover, a large range of photopolymer sheets of all thicknesses and in all sizes (up to 50×80 inches) currently exist on the market. Semi-automatic machines are already manufactured on which the photopolymer plate is fixed or stuck to the plate-holding tray and a flat brush with orbital movement, steeped in an etching bath, makes it possible to make plates.

Another object of the invention is therefore to make photopolymer plates of all sizes and thicknesses, in a simple machine, making it possible to insert an already exposed plate from one side and to recover it after etching, almost dry, in as short a time as possible.

In order to achieve these objects, several problems had to be solved, in particular:
— reducing the duration of the etching operation;
— automatic holding of the plate in the etching position;
— putting the plate in the etching position automatically;
— uniform etching over the entire surface;
— etching sheets of any thickness without special adjustments to be performed;
— etching sheets of any size.

SUMMARY OF THE INVENTION

In accordance with the present invention, the novel process for making plates from a photopolymer sheet preexposed to ultraviolet radiation so as to convert them into printing plates for flexography, letterpress or dryoffset printing, is characterized in that it includes at least the following steps:
— insertion of the sheet sensitive side facing upwards, at high speed, on an etching plane and beneath a set of brushes;
— etching by the resultant of an alternating movement of the flat brushes and of a to-and-fro movement of the set of brushes in a horizontal direction perpendicular to that of the brushes, the sheet being held automatically during etching.

The flat brushes are independent of each other. The sheet is held automatically onto the bearing-plate, during etching, by the pressure of the brushes which reduces to zero any directional thrust forces. The injection of the etching liquid takes place through the brushes.

Furthermore, the process preferably includes the following prior steps:
— rapid introduction and attachment of the sheet sensitive side upwards;
— putting the sheet in position beneath the brushes and lowering the brushes.

After etching, the process preferably includes the following steps:
— automatic raising of the brushes;
— transfer of the sheet towards the unit for automatically rinsing and cleaning both sides;
— transfer into the pre-drying part.

BRIEF DESCRIPTION OF THE DRAWINGS

The invention will be better understood with the aid of the description below, given with reference to the following appended Figures.

DETAILED DESCRIPTION OF A PREFERRED EMBODIMENT

Figure 1:
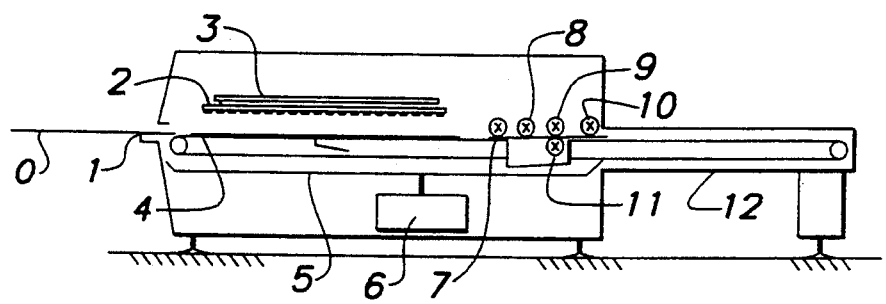
FIGS. 1 to 8 are sketches showing the successive steps of the process.

The process according to the invention includes at least the following steps:
— Rest step (see FIG. 1)

Figure 2:
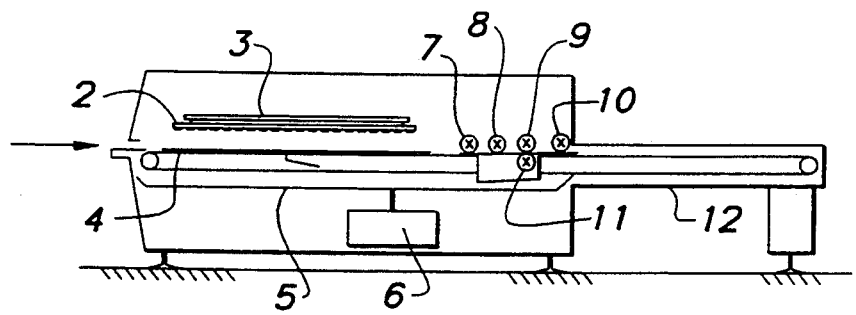

A photopolymer sheet (0), pre-exposed to the UV rays, is attached to a feed bar (1) by the operator,
— Introduction of the sheet (0) (see FIG. 2)

The operator introduces the bar at the input of the machine onto the input table.

An "on" button is pressed, having pre-adjusted the etching time on the timer according to the thickness of the photopolymer layer to be removed as well as the quantity of replenishment etching (liquid as a function of the etching depth required).

Figure 3:
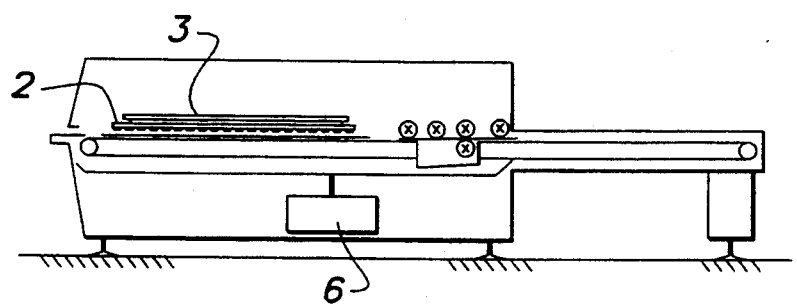

The sheet (0) is positioned at high speed beneath the brushes (2) and rests on the perfectly flat etching plane (4) which, is itself supported by a liquid-recovery tank (5) connected to a reservoir (6).
— Lowering of the brushes (2) (FIG. 3)

In order that the sheet (0) does not move during the etching, it is necessary for the sheet (0) to be positioned at all times beneath the brushes and for this to be done for any size of plate (0).

While the brushes (2) are being lowered, the etching liquid splashes the sheet (0) through, the brushes, and the movement of the brush holder (3) starts from right to left.

Figure 4:
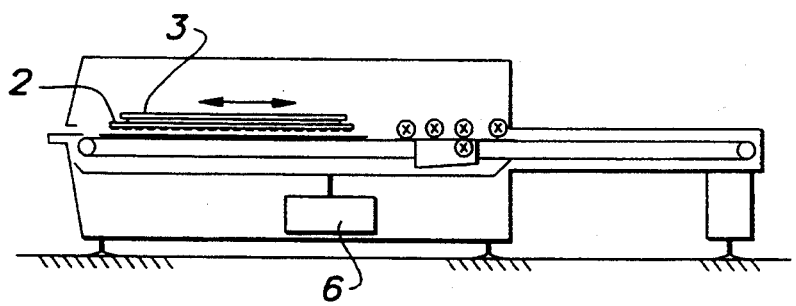

Just before touching the sheet (0), the brushes (2) are set into motion (alternating movement) during the lowering.
— Etching (FIG. 4)

During the etching, each brush (2) rubs the surface of the sheet (0). Each brush (2) carries a weight which makes it possible, depending on its surface, to etch the photopolymer at a variable rate. This weight is determined in order to have between from 15 to 18 grams per $cm^2$ between the sheet (0) and the brush (2).

The etching liquid comes through the brushes bodies (2).

The sheet (0) is immobilized on the etching table (4), during the etching, by the alternating movement in a direction X (FIG. 4) of each of the brushes (2) together.

Figure 5:
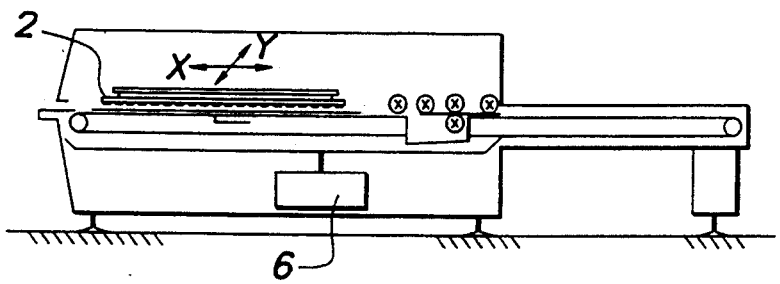

In order to have uniform etching of the surface of the photopolymer sheet (0), the brush support (3) drives the entire set of brushes (2) in a direction Y (FIG. 5) from right to left, i.e. perpendicular to the direction X of the alternating movement of the brushes (2).

The resultant: (FIG. 5)
. of the alternating movement of the flat brushes (2) and
. of the left-to-right movement of the set of brushes (2)

makes it possible to hold the sheet (0) in fixed position, without attachment, and to have a system of uniform etching over the entire surface in two orthogonal directions for any size of photopolymer sheet, and this is done in a single pass.

Since the set of brushes covers the entire surface of the sheet during the etching, it makes it possible to etch the entire surface simultaneously in one pass.

The act of thus etching, in a single pass, the totality of the surface makes it possible to have very rapid etching, and the sheet (0) does not have time to absorb the etching liquid and therefore to swell.

Each brush (2) is independent and free in relation to each other; that is to say is "floating".

Its weight allows the surface of the photopolymer to be rubbed and material to be removed by the rubbing of the bristles of the brushes (bearing force of from 15 to 18 $g/cm^2$).

This system makes it possible to be able to etch any thickness of photopolymer sheet without prior height adjustment of the brushes (3). In order to etch, it will be necessary only to pre-adjust the etching time.

Figure 6:
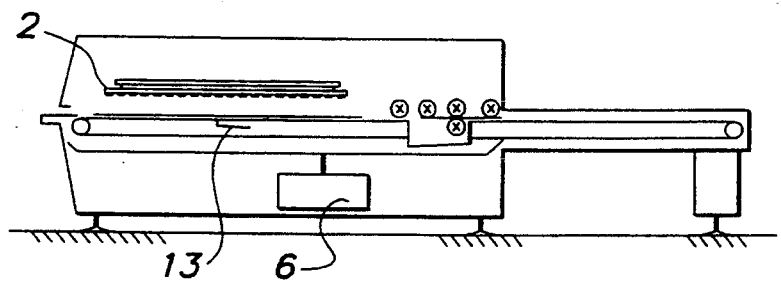

—End of etching (FIG. 6)

The brush support (3) brings the brushes (2) back up at the end of etching.

In order to be able to pull the sheet (0) along more easily by means of the studded chain, the etching product is injected from below, between the sheet (0) and the sheet support (4), by a means (13), since the sheet (0) has a tendency to stick to the support plate (4) (especially in the case of large-sized sheets).

Figure 7:
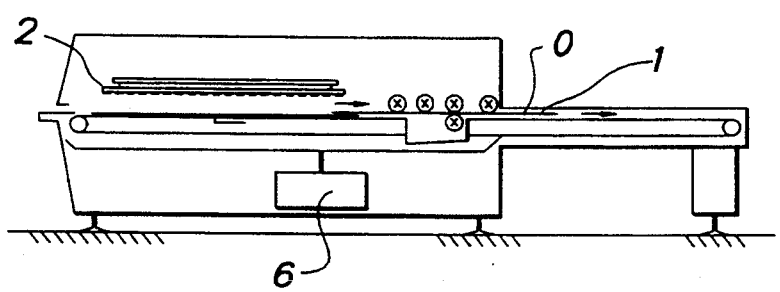

—Rinsing and cleaning (FIG. 7)

The sheet (0) is pulled along by the bar (1) which is attached at each end to a studded chain.

A first spiralled rotation brush (7) removes the saturated etching product lying on the sheet (0).

Another brush (8) splashed with fresh product cleans the surface of the sheet (0) to be etched.

The rotary brush (9) wipes the surface of the sheet (0).

The rotary brush (11), steeped in a tank of clean liquid, will rinse the back of the sheet (0) automatically as it passes.

It should be noted that the brushes (11 and 9) are cleaned mutually by rubbing together when there is no sheet (0) passing.

A final, dense, brush (10), wetted by an applicator of fresh liquid, wipes the surface of the sheet (0) on passing (relief of the printing sheet).

Figure 8:
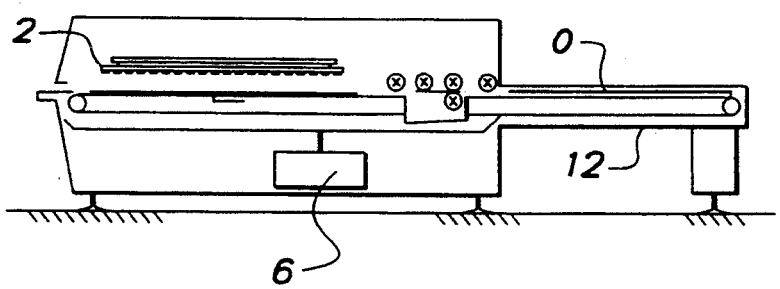
Figure 9:
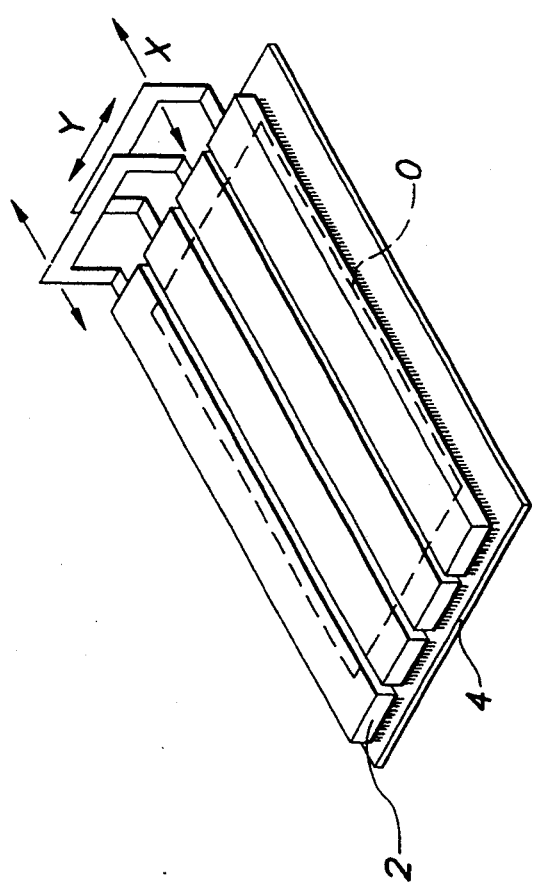
FIG. 9 is a sketch showing the flat brushes.

—Pre-drying, end of cycle (FIG. 8)

On reaching this pre-drying chamber (12), the surface of the sheet (0) is wet, but no drop of product remains on the sheet (0). During the pre-drying, the chamber is heated to approximately 60° C.

When the photopolymer sheet (0) reaches the pre drying section (12), it is possible to reintroduce another sheet (0) according to the step of FIG. 1.

This process offers many advantages, in particular:
—the machine overall is very simple and requires no accurate pre-adjusting;
—there is no height adjustment of the brushes according to the various thicknesses of sheets (0);
—the brushes are independent of each other and are therefore floating, that is to say free, bearing on the sheet to be developed under their own weight (no adjusting);
—etching the sheet in a single pass over the entire surface, yielding an etching-time reduction;
—etching any size;
—complete automation of the steps;
—minimal absorption of etching product by the sheet; therefore no distortion of the characters;
—very rapid etching along X and Y in order to have perfect etching uniformity;
—etching along X by several brushes in alternating movement with respect to each other (from 40 to 80 mm travel);
—etching along Y by right-to-left motion of the set of brushes (from between 50 and 120 mm travel).

I claim:

1. A process for making plates from a photopolymer sheet that has been pre-exposed to ultraviolet radiation to form a sensitive side, for converting the sheet into printing plates for flexography, letterpress or dry-offset printing, comprising the steps of:

inserting the sheet into an apparatus for etching the plates at high speed, with the sensitive side facing upwardly and with the sheet lying on an etching plane and beneath a set of flat brushes; and etching the sheet while alternatingly moving the flat brushes, and while moving the brushes to-and-fro in a horizontal direction perpendicular to the alternating movement of the brushes, wherein the sheet is automatically held in position by the brushes during the etching step.

2. The process of claim 1 which further includes the steps of:

rapidly attaching the sheet to a bar, for introduction into the apparatus with the sensitive side facing upwardly; and positioning surface portions of the sheet beneath the brushes.

3. The process of claim 1 which further includes the steps of:

lowering the brushes onto the sheet; and splashing etching liquid through the brushes and onto the sheet.

4. The process of claim 1 which, after the etching step, further includes the steps of:

automatically raising the brushes;

injecting an etching product beneath the sheet to facilitate sliding of the sheet; and automatically rinsing and cleaning surface portions of the sheet and back portions of the sheet.

5. The process of claim 4 which further includes the step of transferring the etched sheet to an inspection area, for inspection of the etched surface portions.

6. The process of claim 5 which further includes the step of pre-drying the transferred sheet.

7. An apparatus for making plates from a photopolymer sheet that has been pre-exposed to ultraviolet radiation to form a sensitive side, for converting the sheet into printing plates for flexography, letterpress or dry-offset printing following insertion of the sheet into the apparatus at high speed and with the sensitive side of the sheet facing upwardly, the apparatus comprising an etching tank, a bearing-plate supported by the etching tank for receiving the sheet and for maintaining the sheet perfectly flat during etching of the plates, and a plurality of flat brushes carried by a brush support for movement independent of each other and above the bearing-plate, wherein the sheet is automatically held in position by the brushes during etching of the plates, with the sheet lying on an etching plane beneath the set of brushes.

8. The apparatus of claim 7 which further includes mechanical means for horizontally driving the brushes in a first, alternating direction, and in a second, to-and-fro direction perpendicular to the first direction.

9. The apparatus of claim 7 which further includes a feed bar for high-speed positioning of a sheet to be etched completely beneath the brushes.

10. The apparatus of claim 7 which further includes a first rotary brush for performing a first rinsing, paired rotary brushes following the first rotary brush, wherein the paired rotary brushes are steeped in a tank of clean liquid and arranged for cleaning and rinsing of the sheet, and a second rotary brush wetted by a liquid applicator, for wiping surface portions of the sheet.

* * * * *